United States Patent [19]
Tsuji et al.

[11] Patent Number: 5,394,111
[45] Date of Patent: Feb. 28, 1995

[54] OPERATIONAL AMPLIFIER WITH JUNCTION FIELD EFFECT TRANSISTORS AS INPUT TRANSISTOR PAIR

[75] Inventors: Kazuhiro Tsuji, Yokohama; Masayuki Sahoda, Kawasaki, both of Japan

[73] Assignee: Kabushiki Kaisha Toshiba, Kawasaki, Japan

[21] Appl. No.: 995,012

[22] Filed: Dec. 23, 1992

[30] Foreign Application Priority Data

Dec. 24, 1991 [JP] Japan .................................. 3-340558

[51] Int. Cl.[6] .............................................. H03F 1/02
[52] U.S. Cl. ......................................... 330/9; 330/300
[58] Field of Search ...................... 330/9, 51, 255, 253, 330/277, 300; 307/494

[56] References Cited

U.S. PATENT DOCUMENTS

| | | | |
|---|---|---|---|
| 4,135,162 | 1/1979 | Takahashi | 330/255 |
| 4,783,602 | 11/1988 | Viswanathan | 330/255 X |
| 5,068,622 | 11/1991 | Mead et al. | 330/253 |

OTHER PUBLICATIONS

Roettcher, "A Compatible CMOS-JFET Pulse Density Modulator for Interpolative High-Resolution A/D-Conversion", IEEE Journal of Solid-State Circuits, vol. SC-21, No. 3, Jun. 1986.

*Primary Examiner*—Steven Mottola
*Attorney, Agent, or Firm*—Banner, Birch, McKie and Beckett

[57] ABSTRACT

In an operational amplifier circuit, noise is lowered by using junction FETs as an input transistor pair, and an input operating point and an output operating point can be set at different potentials by connecting a capacitor between an output terminal and an inverting input terminal. For this reason, the operational amplifier circuit can be properly biased and can be operated at a low power supply voltage. In addition, since transistors other than transistors used as constant current sources are constituted by bipolar transistors, the operational amplifier circuit can have wideband frequency characteristics.

16 Claims, 9 Drawing Sheets

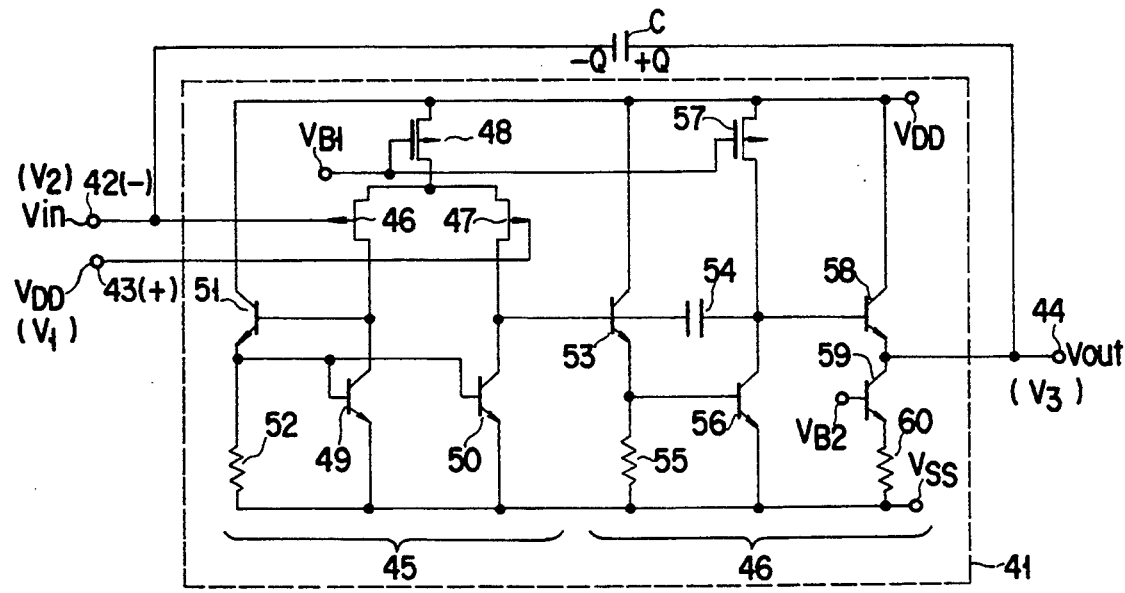
F I G. 4
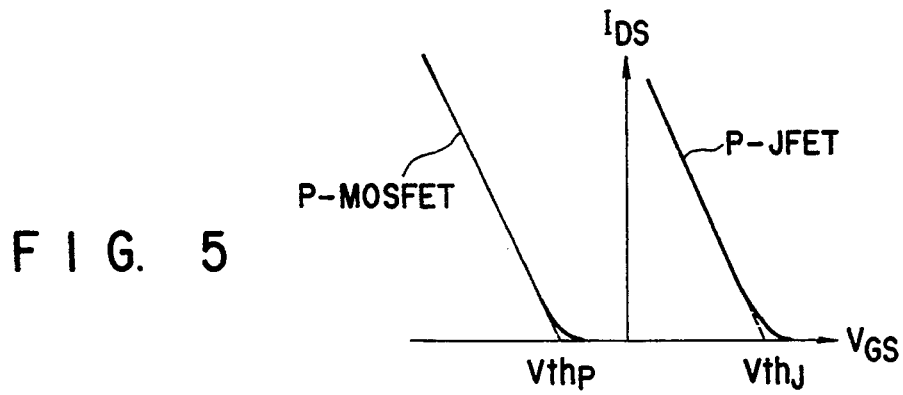
F I G. 5
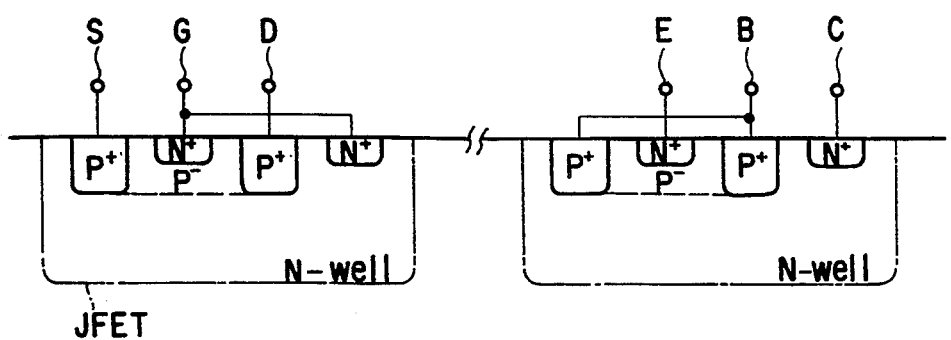
F I G. 6

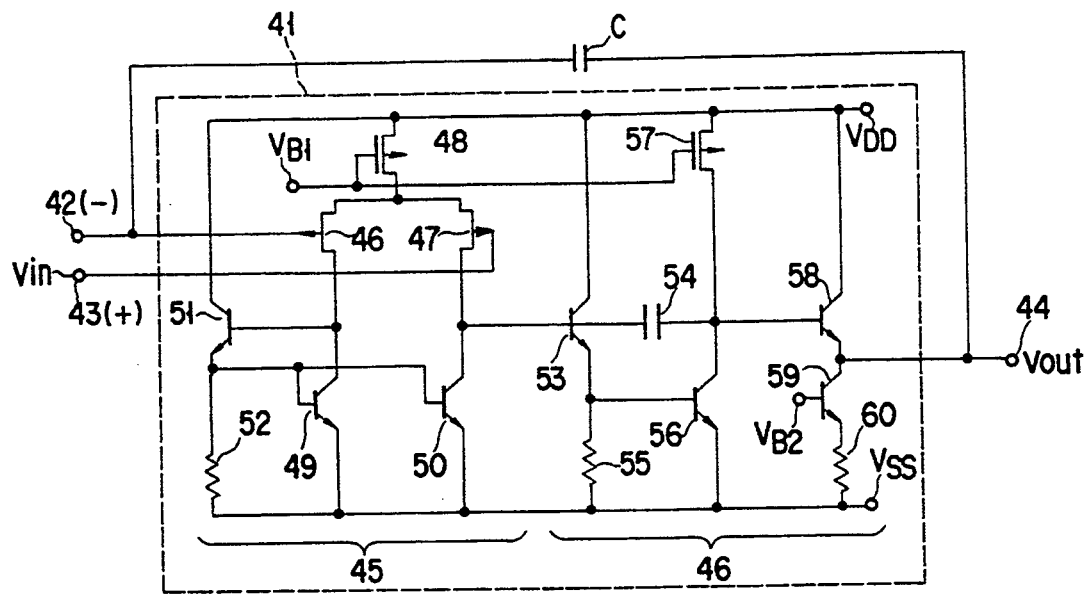
F I G. 7
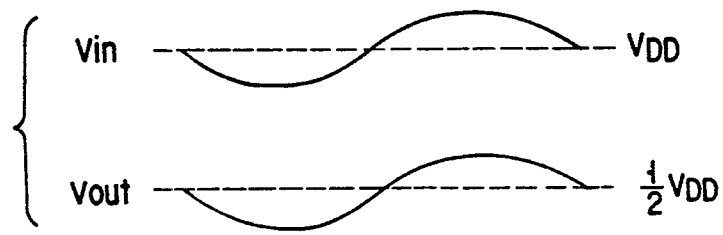
F I G. 8

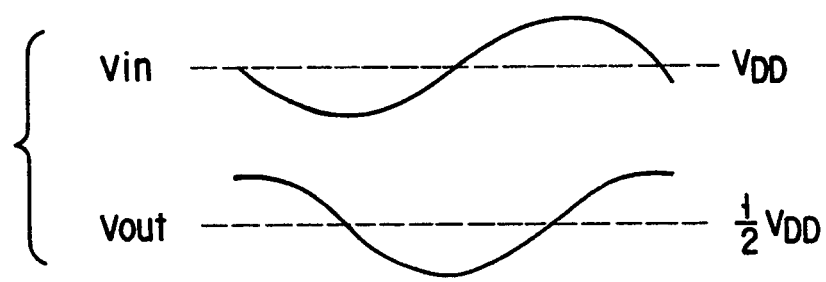
F I G. 11
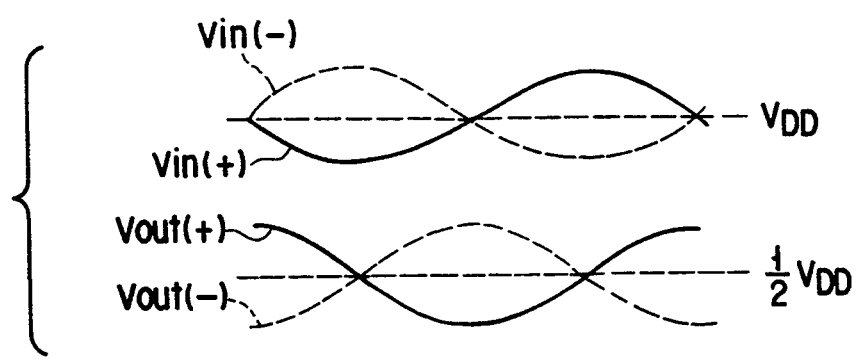
F I G. 14

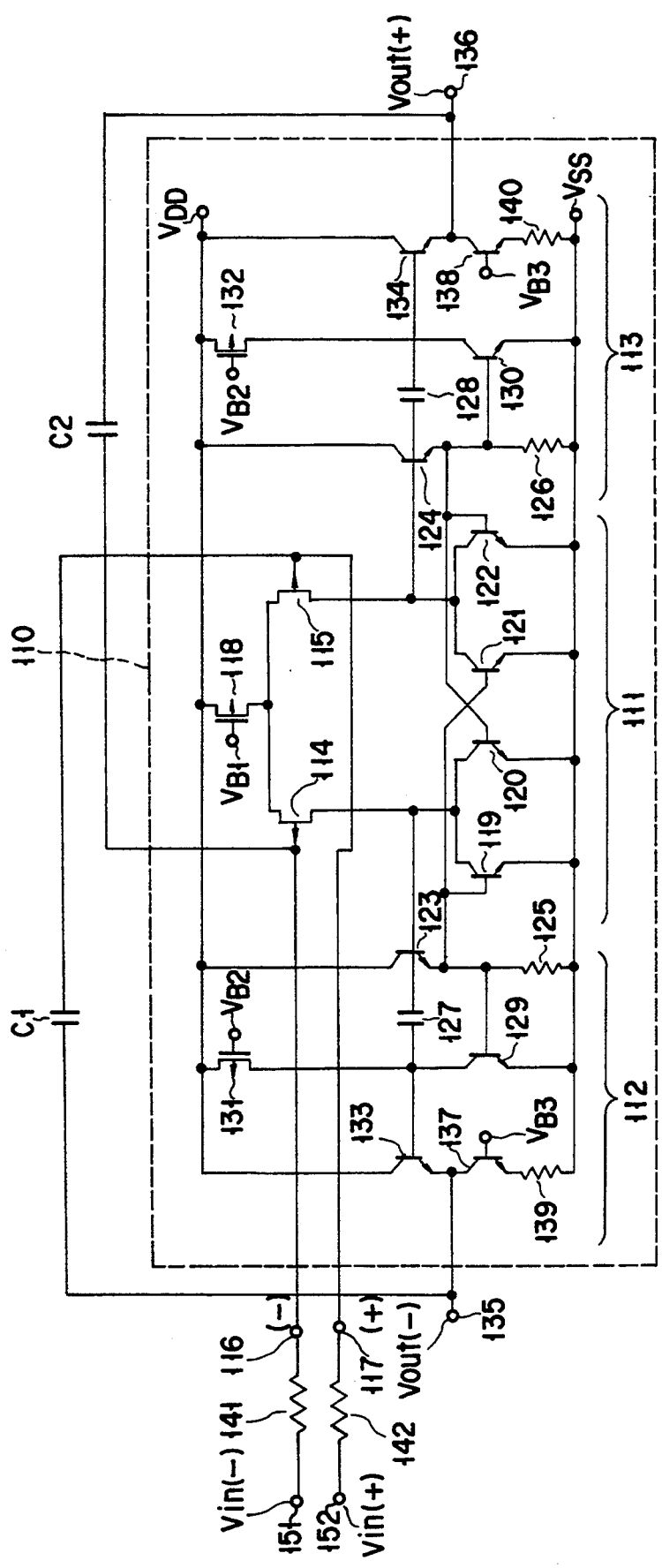
F I G. 13

OPERATIONAL AMPLIFIER WITH JUNCTION FIELD EFFECT TRANSISTORS AS INPUT TRANSISTOR PAIR

BACKGROUND OF THE INVENTION

1. Field of the Invention

The present invention relates to an operational amplifier used in a switched capacitor filter or the like.

2. Description of the Related Art

FIG. 1 is a circuit diagram showing a conventional operational amplifier used in a switched capacitor filter. The operational amplifier comprises a differential circuit 11 and a source ground circuit 12 connected to the differential circuit 11. The differential circuit 11 comprises P-channel MOS transistors (referred to as PMOS transistors hereinafter) 13 and 14 serving as an input transistor pair, a PMOS transistor 15 serving as a constant current supply, and N-channel MOS transistors (referred to as NMOS transistors hereinafter) 16 and 17 serving as a current mirror. The source ground circuit 12 comprises a phase-compensating capacitor 18, a resistor 19, a PMOS transistor 20 serving as a constant current supply, and an NMOS transistor 21. A high input impedance can be obtained in the above operational amplifier since the MOS transistors 13 and 14 are used as the input transistor pair. However, this operational amplifier has the following drawbacks. Since a MOS transistor has 1/f noise or the like, input conversion noise is increased. In addition, the MOS transistor has a low cutoff frequency $f_T$, the operational amplifier cannot easily have wideband frequency characteristics. On the other hand, an operational amplifier using bipolar transistors as input transistors can have wideband frequency characteristics with low noise. However, since the bipolar transistor has a low input impedance, a drawback is posed that the bipolar transistor cannot be preferably applied to a circuit such as a switched capacitor filter (SCF).

FIG. 2 is a circuit diagram showing a conventional operational amplifier using P-channel junction FETs (referred to as JFETs). This amplifier has P-channel JFETs 22 and 23 as an input transistor pair. In order to solve the above drawbacks, JFETs having low noise and a high input impedance may be used as the input transistors of an operational amplifier. However, the operational amplifier has the following drawbacks. First, since depletion type JFETs are used as the input transistors in general, when a potential half of a power supply voltage is set as an input operating point, the transistors in the operational amplifier cannot be normally biased because the potential at the input operating point is excessively low. More specifically, this operational amplifier cannot be operated when a low power supply voltage is used. Second, when JFETs are used as an input transistor pair, noise can be reliably reduced. However, since other transistors constituting the operational amplifier are of MOS transistors, the operational amplifier cannot easily have wideband frequency characteristics. Due to the above drawbacks, the operational amplifier using JFETs as an input transistor pair cannot be easily realized. Therefore, there is only the following prior art in which an input transistor pair constituted by JFETs are used in a comparator.

FIG. 3 is a circuit diagram showing the arrangement of a conventional comparator using JFETs as an input transistor pair. This comparator is disclosed in the reference, "A Compatible CMOS-JFET Pulse Density Modulator for Interpolative High-Resolution A/D conversion"; Ulrich Roettcher et al. (IEEE J. of solid-state circuits, Vol.sc-21, No. 3, June 1986, pp 446–452). In this comparator, JFETs 31 and 32 are used as an input transistor pair. Although a detailed description of other circuit arrangements is omitted, the comparator is different from an operational amplifier in the following points. First, since an output signal need not be fed back to an input side, the transistors of the comparator can be easily biased. Second, since the output signal is not fed back to the input side, the phase of the output signal need not be compensated, and the operational amplifier can easily have wideband frequency characteristics. In this manner, the JFETs can be easily used as the input transistor pair in the comparator. However, an operational amplifier cannot be easily formed by the same technique used in the above comparator.

SUMMARY OF THE INVENTION

The present invention has been made to solve the above drawbacks, and has an object to provide an operational amplifier which uses JFETs as an input transistor pair, can properly set bias voltages in transistors and can have wideband frequency characteristics.

According to an aspect of the present invention, there is provided an operational amplifier comprising: an operational amplifier circuit having an inverting input terminal, a non-inverting input terminal, an output terminal, and an input transistor pair which have gates connected to the inverting input terminal and the non-inverting input terminal, respectively, and which are constituted by junction FETs; and a capacitor element, arranged between the output terminal and the inverting input terminal, for feeding back an output signal voltage to the inverting input terminal and setting an input operating potential and an output operating potential at different potentials.

According to another aspect of the present invention, there is provided a switched capacitor integrator comprising: an operational amplifier circuit having an inverting input terminal, a non-inverting input terminal, an output terminal, and an input transistor pair which have gates connected to the inverting input terminal and the non-inverting input terminal, respectively, and which are constituted by junction FETs; a capacitor element, arranged between the output terminal and the inverting input terminal, for feeding back an output signal voltage to the inverting input terminal and setting an input operating potential and an output operating potential at different potentials; and a switched capacitor circuit connected between the inverting input terminal and the non-inverting input terminal.

According to another aspect of the present invention, there is provided an operational amplifier comprising: an operational amplifier circuit having an inverting input terminal, a non-inverting input terminal, an output terminal, an input transistor pair which have gates connected to the inverting input terminal and the non-inverting input terminal, respectively, and which are constituted by junction FETs, a constant current supply constituted by MOS transistors, and a remaining circuit constituted by bipolar transistors; and a capacitor element, arranged between the output terminal and the inverting input terminal, for feeding back an output signal voltage to the inverting input terminal and setting an input operating potential and an output operating potential at different potentials.

According to another aspect of the present invention, there is provided a switched capacitor integrator comprising: an operational amplifier circuit having an inverting input terminal, a non-inverting input terminal, an output terminal, and an input transistor pair which have gates connected to the inverting input terminal and the non-inverting input-terminal, respectively, and which are constituted by junction FETs, a constant current supply constituted by MOS transistors, and a remaining circuit constituted by bipolar transistors; a capacitor element, arranged between the output terminal and the inverting input terminal, for feeding back an output signal voltage to the inverting input terminal and setting an input operating potential and an output operating potential at different potentials; and a switched capacitor circuit connected between the inverting input terminal and the non-inverting input terminal.

In the present invention, in an operational amplifier circuit using junction FETs as an input transistor pair, since a capacitor element is connected between the output and input terminals of the operational amplifier circuit, input and output operating points can be set at different potentials, and the transistors in the operational amplifier circuit can be properly biased. In addition, since transistors other than a transistor used as a constant current supply are constituted by bipolar transistors, wideband frequency characteristics can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram showing the arrangement of an operational amplifier circuit according to the first embodiment of the present invention;

FIG. 5 is a graph showing characteristics of a PMOS transistor and an N-channel JFET;

FIG. 6 is a schematic sectional view showing the arrangements of a PMOS transistor and a P-channel JFET;

FIG. 7 is a circuit diagram showing the arrangement of a voltage follower according to the second embodiment of the present invention;

FIG. 8 is a waveform chart showing input and output signals of the voltage follower in FIG. 7;

FIG. 11 is a waveform chart showing input and output signals of the integrator shown in FIG. 10;

FIG. 13 is a circuit diagram showing the arrangement of a switched capacitor integrator according to the fifth embodiment of the present invention;

FIG. 14 is a waveform chart showing input and output signals of the integrator shown in FIG. 13.

DETAILED DESCRIPTION OF THE PREFERRED EMBODIMENTS

Figure 1:
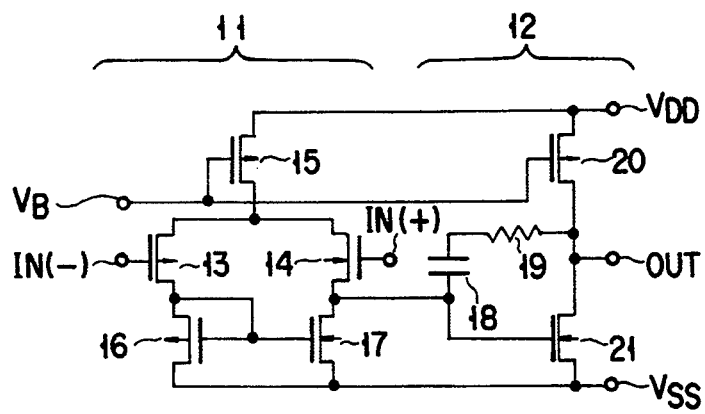
FIG. 1 is a circuit diagram showing the arrangement of a conventional operational amplifier.
Figure 2:
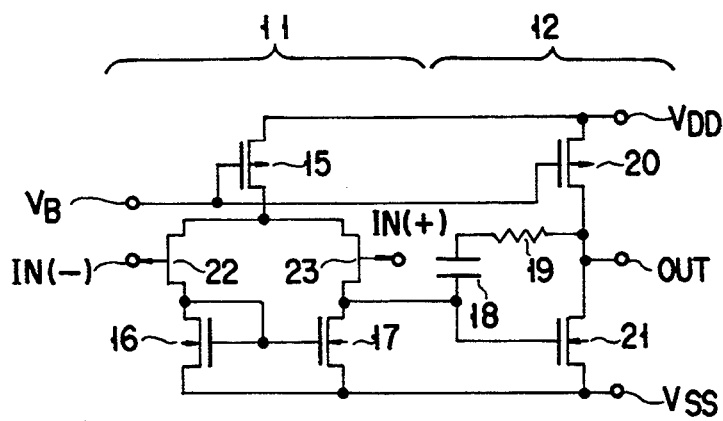
FIG. 2 is a circuit diagram showing the arrangement of another conventional operational amplifier.
Figure 3:
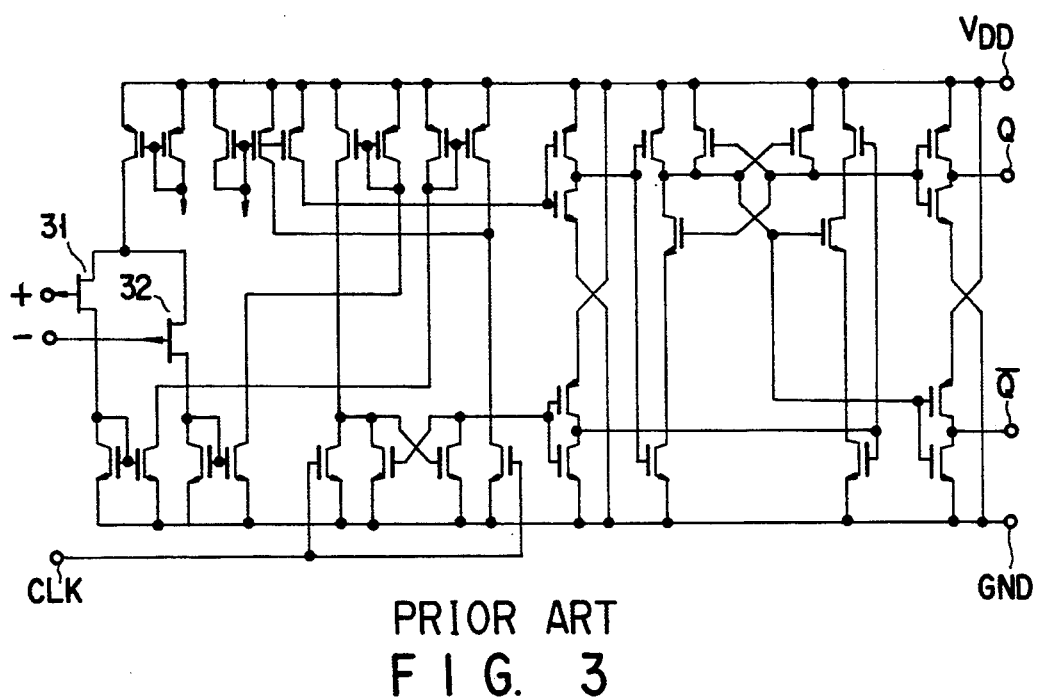
FIG. 3 is a circuit diagram showing the arrangement of a conventional comparator.

Embodiments of the present invention will be described below with reference to the accompanying drawings.

FIG. 4 is a circuit diagram showing the arrangement of an operational amplifier circuit according to the first embodiment of the present invention. In FIG. 4, the inverting input terminal (−) of an operational amplifier circuit 41 is connected to an input terminal 42. The non-inverting input terminal (+) of the operational amplifier circuit 41 is connected to an input terminal 43. The output terminal of the operational amplifier circuit 41 is connected to an output terminal 44. A capacitor C is connected between the output terminal 44 of the operational amplifier circuit 41 and the inverting input terminal 42. The operational amplifier circuit 41 comprises a differential circuit 45 and an emitter ground circuit 46 connected to the differential circuit 45. In the differential circuit 45, the gates of P-channel JFETs 46 and 47 constituting an input transistor pair are connected to the input terminal 42 serving as the inverting input terminal (−) and to the input terminal 43 serving as the non-inverting input terminal (+), respectively. The sources of the JFETs 46 and 47 are connected to a power supply $V_{DD}$ through a PMOS transistor 48 serving as a constant current supply. The gate of the MOS transistor 48 is connected to the power supply $V_{B1}$. The drains of the JFETs 46 and 47 are connected to the collectors of NPN transistors 49 and 50, respectively. The emitters of the transistors 49 and 50 are connected to a power supply $V_{SS}$, and the bases of the transistors 49 and 50 are connected to the emitter of an NPN transistor 51 for converting an impedance. The emitter of the NPN transistor 51 is connected to the power supply $V_{SS}$ through a resistor 52, the base of the transistor 51 is connected to the drain of the JFET 46, and the collector of the transistor 51 is connected to the power supply $V_{DD}$. On the other hand, in the emitter ground circuit 46, the base of an NPN transistor 53 is connected to the drain of the JFET 47 and one terminal of a phase-compensating capacitor 54. The collector of the transistor 53 is connected to the power supply $V_{DD}$, and the emitter of the transistor 53 is connected to the power supply $V_{SS}$ through a resistor 55 and to the base of an NPN transistor 56. The emitter of the transistor 56 is connected to the power supply $V_{SS}$, and the collector of the transistor 56 is connected to the other terminal of the capacitor 54, to the drain of a PMOS transistor 57 constituting a constant current supply, and to the base of an NPN transistor 58. The gate of the PMOS transistor 57 is connected to the power supply $V_{B1}$, and the source of the transistor 57 is connected to the power supply $V_{DD}$. The collector of the NPN transistor 58 is connected to the power supply $V_{DD}$, and the emitter of the transistor 58 is connected to the output terminal 44 and the collector of an NPN transistor 59. The base of the NPN transistor 59 is connected to a power supply $V_{B2}$, and the emitter of the transistor 59 is connected to the power supply $V_{SS}$ through a resistor 60. The transistors 58 and 59 constitute an impedance converter of an emitter follower. In addition, the capacitor C is connected between the output and input terminals 44 and 42.

An operation of the operational amplifier in FIG. 4 will be described below in detail. As shown in FIG. 4, a bias potential applied to the input terminal 43, i.e., non-inverting input terminal (+), a bias potential applied to the input terminal 42, i.e., inverting input terminal (−), and a bias potential of the output terminal 44 are represented by V1, V2, and V3, respectively. The gain of the operational amplifier circuit 41 is represented by A (A>0), the charge of the capacitor C is represented by Q, and the output operating point is represented by Vop. In this case, the following equations are established:

$$V3 = A(V1 - V2) + Vop \quad (1)$$

$$V3 - V2 = Q/C \quad (2)$$

Therefore, when V2 is eliminated in equations (1) and (2), V3 can be calculated as follows:

$$V3 = AV1/(A+1) + AQ/\{(A+1)C\} + Vop/(A+1)$$

If the gain A is sufficiently large, V3 is almost obtained by V1+Q/C. In addition, $$V2 = AV1/(A+1) - Q/\{(A+1)C\} + Vop/(A+1)$$

Therefore, when the gain A of the operational amplifier circuit 41 is sufficiently large, the input potentials satisfy V2=V1. The output potential V3 is shifted by the potential difference of the capacitor C. That is, the potential V2 of the inverting input terminal (−) is boosted from the output potential V3 by the potential difference of the capacitor C. Therefore, when the bias potential V1 of the non-inverting input terminal (+) is set equal to $V_{DD}$, and $Q = -(\frac{1}{2})C\,V_{DD}$ is satisfied, the bias potential V2 of the inverting input terminal (−) is equal to $V_{DD}$, and the bias potential V3 of the output terminal is set equal to $(\frac{1}{2})V_{DD}$.

FIG. 5 shows $V_{GS}-I_{DS}$ characteristics of a PMOS transistor and a P-channel JFET. As shown in FIG. 5, threshold voltages Vth of the MOS transistor and the JFET have a difference of several volts. For this reason, an operational amplifier is not normally operated when the MOS transistor is simply replaced with a JFET. However, as in the embodiment in FIG. 4, when the capacitor C is connected between the output terminal 44 and the inverting input terminal (−) 42 of the operational amplifier circuit 41, an input operating point is set at the power supply voltage $V_{DD}$, and the JFETs 46 and 47 can be properly biased. For example, the power supply $V_{DD}$ is set at 5 V, the power supply $V_{B1}$ is set at 3.5 V, and the power supply $V_{B2}$ is set at 1.5 V. In this case, if the input potential V2 is set at 2.5 V, and the output potential V3 is set at 2.5 V, sufficiently high bias voltages cannot be applied to the transistors of the operational amplifier circuit 41 by the input potential V2.

However, when the capacitor C is set to have a potential of 1.5 V, the input potential V2 is set to be 4 V. As a result, sufficiently high bias voltages can be applied to the transistors of the operational amplifier circuit 41. Conventionally, an operational amplifier using low noise JFETs as input transistors cannot be operated by a low power supply voltage. However, according to the present invention, an operational amplifier can be operated at the low power supply voltage since the potentials of the input and output operating points can be changed.

As shown in FIG. 6, since a P-channel JFET has almost the same arrangement as that of an NPN bipolar transistor, elements other than the MOS transistors as constant current supplies can be constituted by bipolar transistors in the operational amplifier circuit 41 in FIG. 4. Therefore, the operational amplifier can be operated at high speed and can have wideband frequency characteristics.

FIG. 7 is a circuit diagram showing the arrangement of a voltage follower according to the second embodiment of the present invention. An input signal voltage $V_{in}$ shown in FIG. 8 is applied to an input terminal 43. The input signal voltage $V_{in}$ is a signal which swings with respect to the voltage $V_{DD}$ as a center. In this case, an output signal voltage $V_{out}$ from an operational amplifier circuit 41 swings with respect to a voltage of $(\frac{1}{2})V_{DD}$ when the potential difference of a capacitor C is set to be $(\frac{1}{2})V_{DD}$.

Figure 9:
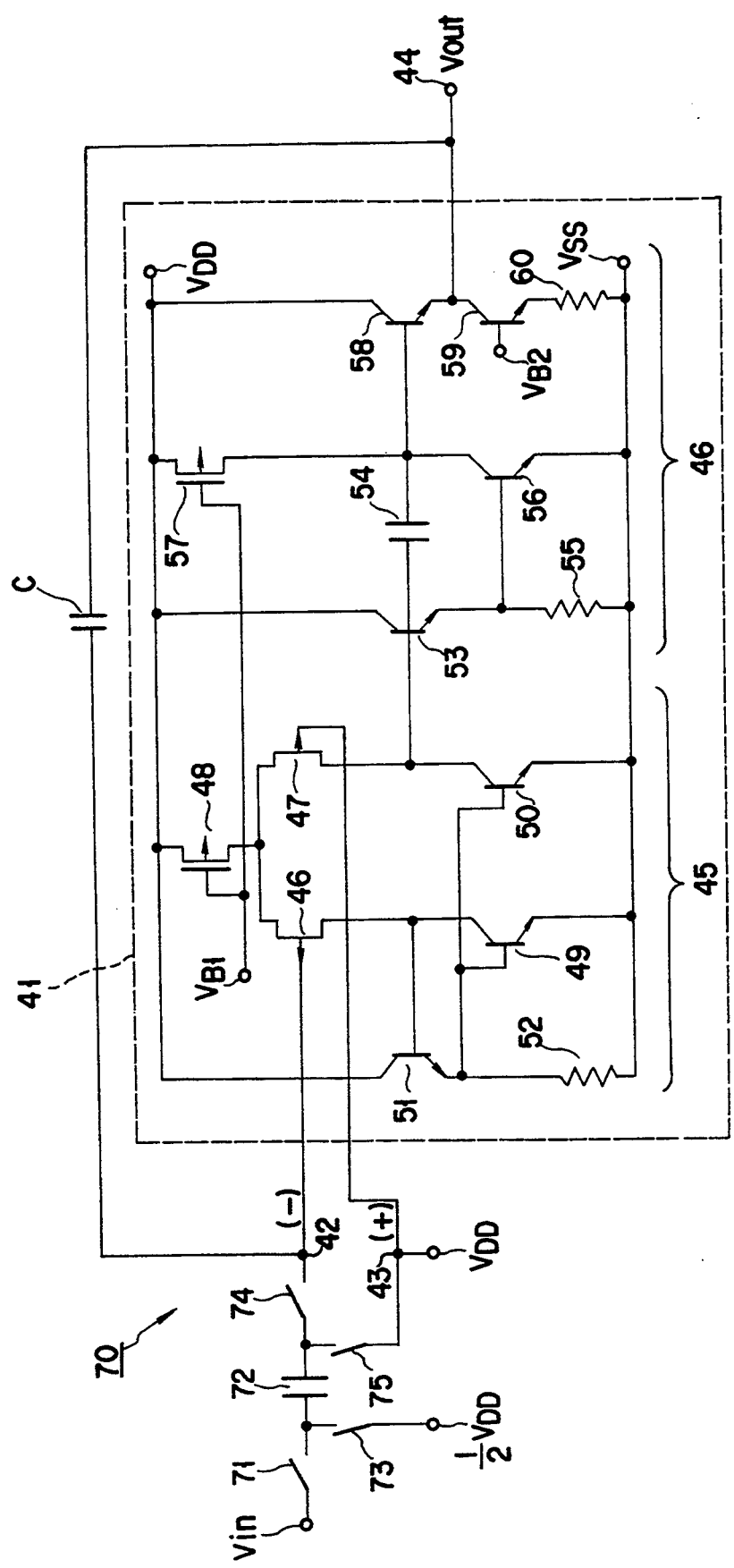
FIG. 9 is a circuit diagram showing the arrangement of a switched capacitor integrator according to the third embodiment of the present invention.

FIG. 9 is a circuit diagram showing the arrangement of a switched capacitor integrator according to the third embodiment of the present invention. An input signal $V_{in}$ is connected to one terminal of a capacitor 72 through a switch 71 constituting a capacitor circuit 70. A power supply $(\frac{1}{2})V_{DD}$ is connected to one terminal of the capacitor 72 through a switch 73. The other terminal of the capacitor 72 is connected to an inverting input terminal (−) 42 of an operational amplifier circuit 41 through a switch 74 and to a non-inverting input terminal (+) 43 of the operational amplifier circuit 41 through a switch 75. With the above arrangement, a desired filter characteristic can be obtained by sequentially switching the switches 71, 73, 74, and 75.

Figure 10:
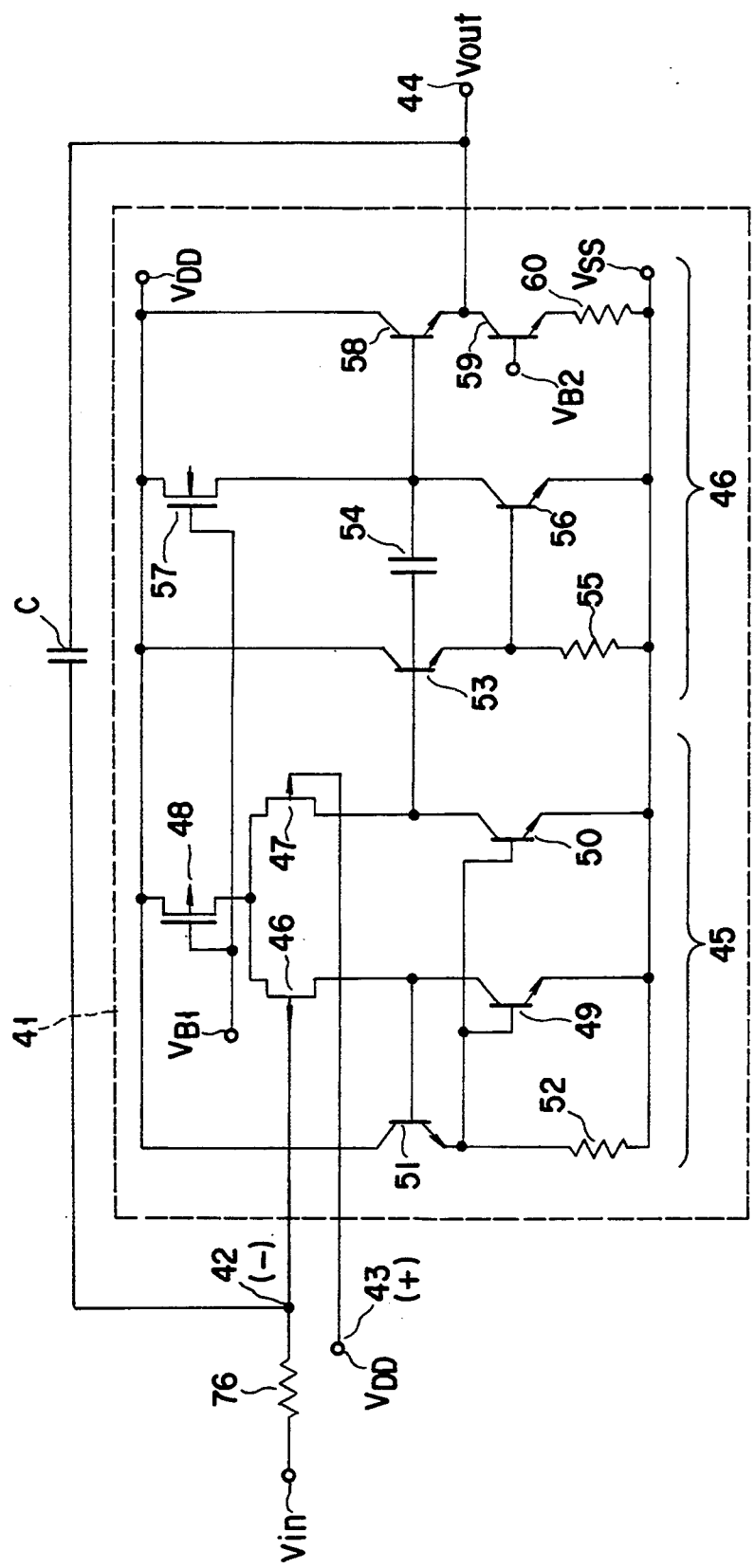
FIG. 10 is a circuit diagram showing the arrangement of an equivalent circuit of the integrator shown in FIG. 9.

FIG. 10 is a circuit diagram showing an equivalent circuit of the integrator shown in FIG. 9. In FIG. 10, the switches 71, 73, 74, and 75 and the capacitor 72 are equivalently represented by a resistor 76. As shown in FIG. 11, an input signal voltage $V_{in}$ in FIG. 10 oscillates with respect to the voltage $V_{DD}$, and an output signal voltage $V_{out}$ from the operational amplifier circuit 41 oscillates with respect to a voltage $(\frac{1}{2})V_{DD}$ by setting the potential difference of the capacitor C to be $(\frac{1}{2})V_{DD}$, thereby obtaining the integrator. However, since a DC component is cut by the switched capacitor in the integrator of FIG. 9, the input signal voltage is a signal oscillating with respect to $(\frac{1}{2})V_{DD}$.

Figure 12:
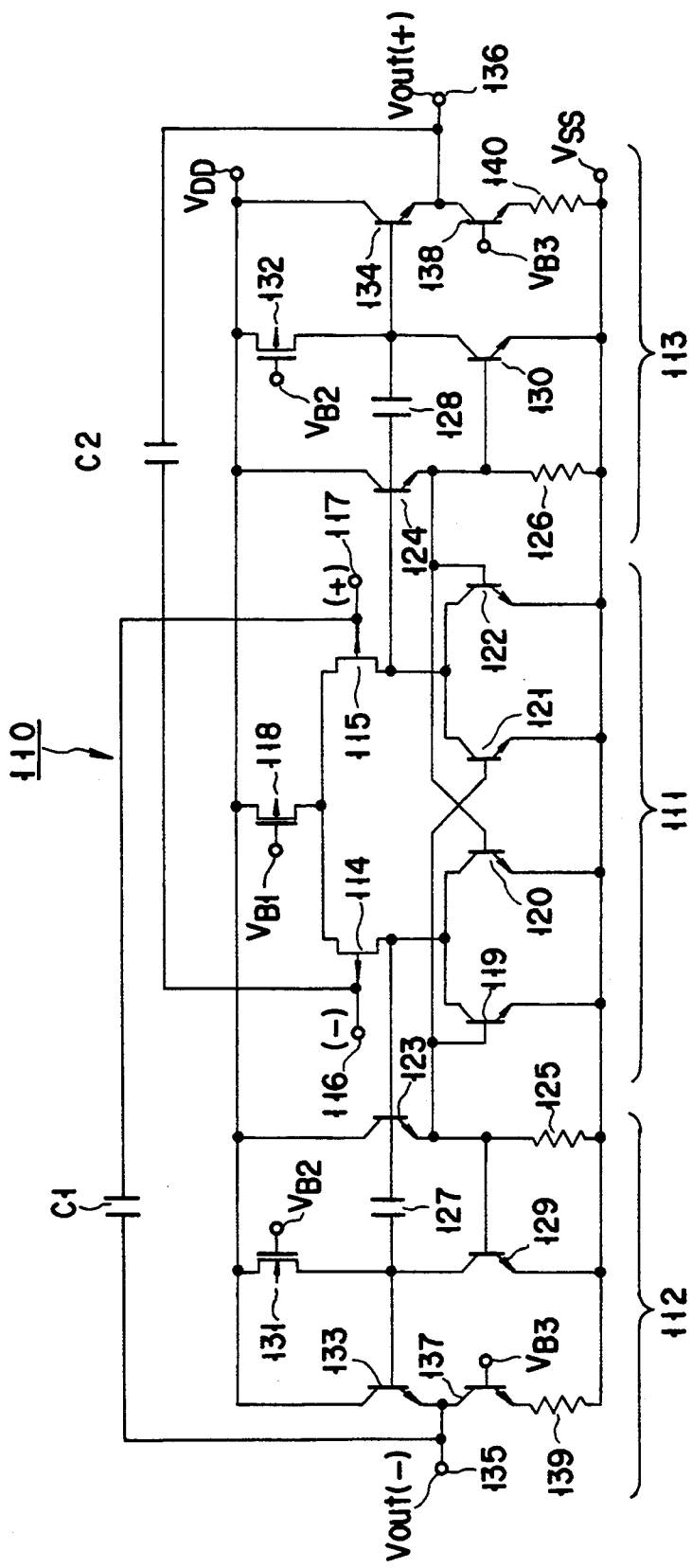
FIG. 12 is a circuit diagram showing the arrangement of a full differential operational amplifier circuit according to the fourth embodiment of the present invention.

FIG. 12 is a circuit diagram showing the arrangement of a full differential operational amplifier circuit according to the fourth embodiment of the present invention. A total differential operational amplifier circuit 110 comprises a differential circuit 111 and emitter ground circuits 112 and 113 connected to the differential circuit 111. In the differential circuit 111, the gate: of P-channel JFETs 114 and 115 are connected to an input terminal 116 serving as an inverting input terminal (−) and an input terminal 117 serving as non-inverting input terminal (+), respectively. The sources of the JFETs 114 and 115 are connected to a power supply $V_{DD}$ through a PMOS transistor 118 serving as a constant current supply. The gate of the PMOS transistor 118 is connected to a power supply $V_{B1}$. The drain of the JFET 114 is connected to the collectors of NPN transistors 119 and 120. The drain of the JFET 115 is connected to the collectors of the NPN transistors 121 and 122. The emitters of the transistors 119 to 122 are connected to a power supply $V_{SS}$. The bases of the transistors 119 and 121 are connected to the emitter of an impedance-converting NPN transistor 123. The bases of the transistors 120 and 122 are connected to the emitter of an NPN transistor 124 The emitters of the transistors 123 and 124 are connected to the power supply $V_{SS}$ through resistors 125 and 126, respectively. The bases of the transistors 123 and 124 are connected to the drains of the JFETs 114 and 115, respectively. The collectors of the transistors 123 and 124 are connected to the power supply $V_{DD}$. On the other hand, in the emitter ground circuits 112 and 113, the base of the NPN transistor 123 is connected to one terminal of a phase-compensating capacitor 127. The base of the NPN transistor 124 is connected to one terminal of a phase-compensating capacitor 128. The emitters of the transistors 123 and 124 are connected to the bases of NPN transistors 129 ad 130, respectively. The emitters of the transistors 129 and 130 are connected to the power supply $V_{SS}$. The collectors of the transistors 129 and 130 are connected to the other terminals of the capacitors 127 and 128, to the drains of PMOS transistors 131 and 112 constituting the constant current supply, to the drains of NPN transistors 133 and 134, and to the bases of NPN transistors 133 and 134, respectively. The gates of the PMOS transistors 131 and 132 are connected to a power supply $V_{B2}$. The sources of the PMOS transistors 131 and 132 are connected to the power supply $V_{DD}$. The collectors of the transistors 133 and 134 are connected to the power supply $V_{DD}$. The emitters of the NPN transistors 133 and 134 are connected to output terminals 135 and 136 and to the collectors of NPN transistors 137 and 138, respectively. The bases of the NPN transistors 137 and 138 are connected to a power supply $V_{B3}$. The emitters of the NPN transistors 137 and 138 are connected to the power supply $V_{SS}$ through resistors 139 and 140, respectively. In addition, a capacitor C1 is connected between the output terminal 135 and the input terminal 117, and a capacitor C2 is connected between the output terminal 136 and the input terminal 116.

FIG. 13 is a circuit diagram showing the arrangement of a switched capacitor integrator according to the fifth embodiment of the present invention. In FIG. 13, resistors 14 and 142 equivalently represent a switched capacitor circuit. When input signal voltages $V_{in}(+)$ and $V_{in}(-)$ are applied to the integrator, relationships between these input signal voltages $V_{in}(+)$ and $V_{in}(-)$ and output signal voltages $V_{out}(+)$ and $V_{out}(-)$ are shown in FIG. 14. Although FIG. 13 shows the circuit obtained by fully differentiating the circuit shown in FIG. 10, the circuit shown in FIG. 13 can be obtained by fully differentiating the circuit in FIG. 9.

With the above embodiments, although the P-channel JFETs are used as an input transistor pair, N-channel JFETs may be used as the input transistor pair.

Figure 15:
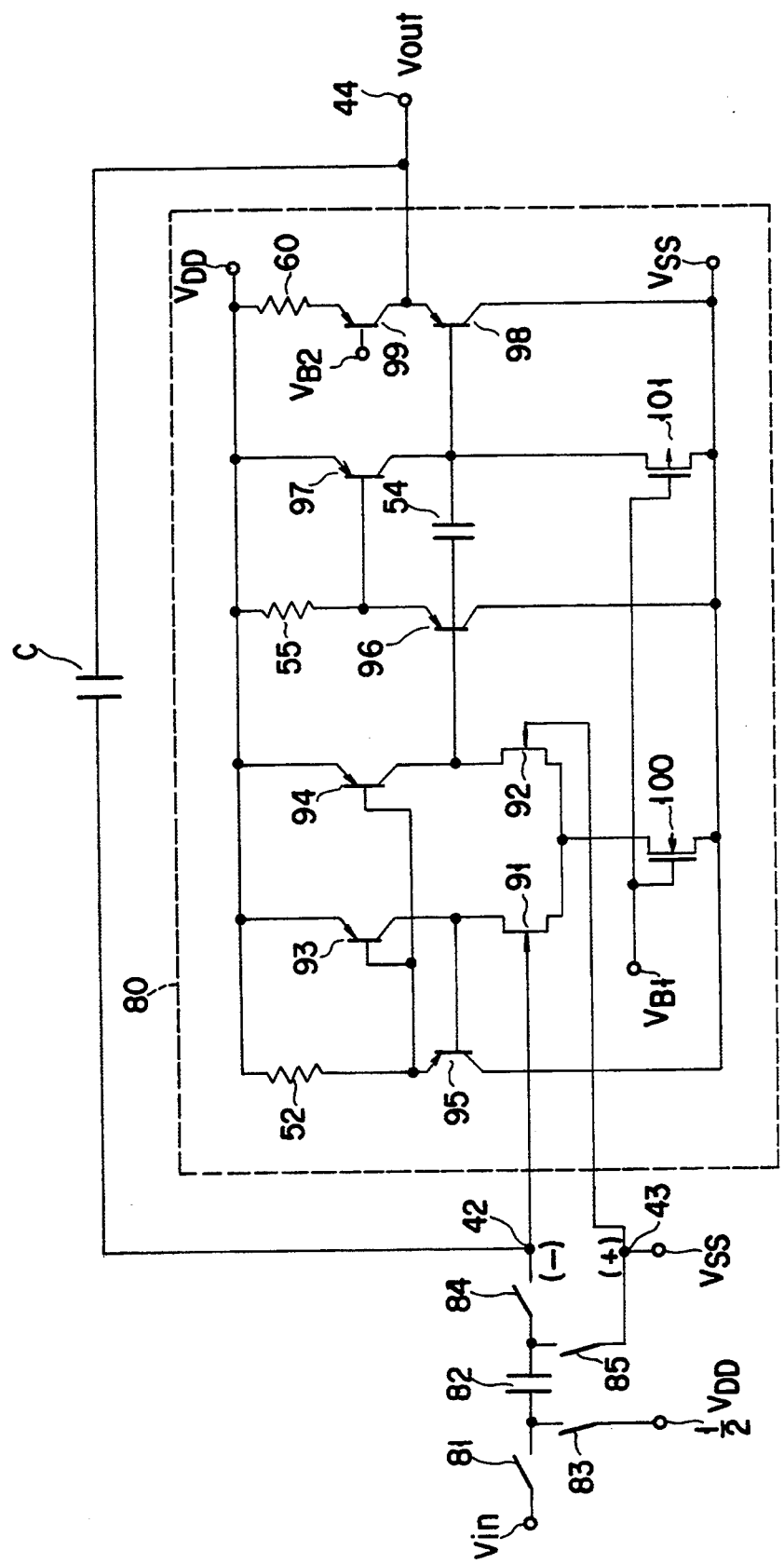
FIG. 15 is a circuit diagram showing the arrangement of an integrator according to the sixth embodiment of the present invention.

FIG. 15 is a circuit diagram showing the arrangement of an integrator according to the sixth embodiment of the prevent invention. This integrator uses an operational amplifier circuit 80 in which an input transistor pair are constituted by N-channel JFETs. This operational amplifier circuit 80 is obtained as follows. That is, in the operational amplifier circuit 41 shown in FIG. 5, the P-channel JFETs 46 and 47 are replaced with N-channel JFETs 91 and 92; the NPN transistors 49, 50, 51, 53, 56, 58, and 59 are replaced with PNP transistors 93, 94, 95, 96, 97, 98, and 99; and the PMOS transistors 48 and 57 are replaced with NMOS transistors 100 and 101. Except for the above arrangement the circuit in FIG. 15 has the same arrangement as that of the circuit in FIG. 4. Therefore, the same reference numerals as in FIG. 4 denote the same parts in FIG. 15, and a description thereof will be omitted. An input signal $V_{in}$ is connected to one terminal of a capacitor 82 through a switch 81. A power supply $(\frac{1}{2})V_{DD}$ is connected to one terminal of the capacitor 82 through a switch 83. The other terminal of the capacitor 82 is connected to the inverting input terminal $(-)$ of the operational amplifier circuit 80 and to the non-inverting input terminal $(+)$ of the operational amplifier circuit 80 through a switch 85. A power supply $V_{SS}$ is connected to the non-inverting input terminal $(+)$. A capacitor C is connected between the inverting input terminal $(-)$ of the operational amplifier circuit 80 and an output terminal 44. Each of the first, second, fourth, and fifth embodiments in which P-channel JFETs are used as an input transistor pair can be arranged as in the sixth embodiment by using N-channel JFETs as an input transistor pair.

In each of FIGS. 8, 11, and 14, a signal changing with respect to the voltage $V_{DD}$ is used as an input signal. The input signal is not limited to this, but any voltage of $(\frac{1}{2})V_{DD}$ or more can be used as the input signal.

As described above, in an operational amplifier or its application circuit according to the present invention, noise can be lowered by using JFETs as an input transistor pair In addition, since an input operating point and an output operating point can be set at different potentials by connecting a capacitor between an output terminal and an inverting input terminal, the JFETs can be properly biased, and the operational amplifier can be operated at a low power supply voltage. Since predetermined parts are constituted by bipolar transistors, the operational amplifier can have wideband frequency characteristics.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An operational amplifier comprising:
an operational amplifier circuit having an inverting input terminal to which an input signal voltage is applied, a non-inverting input terminal which is connected to a power supply potential, and an input transistor pair which have gates connected to said inverting input terminal and said non-inverting input terminal, respectively, and which are constituted by junction FETs and a constant current supply constituted by MOS transistors; and
a capacitor element, arranged between said output terminal and said inverting input terminal, for feeding back an output signal voltage to said inverting input terminal and setting an input operating potential and an output operating potential at different potentials.

2. A switched capacitor integrator comprising:

an operational amplifier circuit having an inverting input terminal, a non-inverting input terminal, an output terminal, and an input transistor pair which have gates connected to said inverting input terminal and said non-inverting input terminal, respectively, and which are constituted by junction FETs;

a capacitor element, arranged between said output terminal and said inverting input terminal, for feeding back an output signal voltage to said inverting input terminal and setting an input operating potential and an output operating potential at different potentials; and a switched capacitor circuit connected between said inverting input terminal and said non-inverting input terminal.

3. An integrator according to claim 2, wherein said non-inverting input terminal is connected to a power supply potential.

4. An integrator according to claim 2, wherein said operational amplifier circuit is constituted by a full differential operational amplifier circuit.

5. An integrator according to claim 2, wherein said junction FETs arc constituted by P-channel junction FETs.

6. An integrator according to claim 2, wherein said junction FETs are constituted by N-channel junction FETs.

7. An operational amplifier comprising:

an operational amplifier circuit having an inverting input terminal, a non-inverting input terminal, an output terminal, an input transistor pair which have gates connected to said inverting input terminal and said non-inverting input terminal, respectively, and which are constituted by junction FETs, a constant current supply constituted by MOS transistors, and a remaining circuit constituted by bipolar transistors; and a capacitor element, arranged between said output terminal and said inverting input terminal, for feeding back an output signal voltage to said inverting input terminal and setting inverting input operating potential and an output operating potential at different potentials.

8. An amplifier according to claim 7, wherein an input signal voltage is applied to said inverting input terminal, and said non-inverting input terminal is connected to a power supply potential.

9. An amplifier according to claim 7, wherein said operational amplifier is operated as a voltage follower by only applying an input signal voltage to said non-inverting input terminal.

10. An amplifier according to claim 7, wherein said junction FFTs are constituted by P-channel junction FETs.

11. An amplifier according to claim 7, wherein said junction FETs are constituted by N-channel junction FETs.

12. A switched capacitor integrator comprising:

an operational amplifier circuit having an inverting input terminal, a non-inverting input terminal, an output terminal, and an input transistor pair which have gates connected to said inverting input terminal and said non-inverting input terminal, respectively, and which are constituted by junction FETs, a constant current supply constituted by MOS transistors, and a remaining circuit constituted by bipolar transistors;

a capacitor element, arranged between said output terminal and said inverting input terminal, for feeding back an output signal voltage to said inverting input terminal and setting an input operating potential and an output operating potential at different potentials; and a switched capacitor circuit connected between said inverting input terminal and said non-inverting input terminal.

13. An integrator according to claim 12, wherein said non-inverting input terminal is connected to a power supply potential.

14. An integrator according to claim 12, wherein said operational amplifier circuit is constituted by a full differential operational amplifier circuit.

15. An integrator according to claim 12, wherein said junction FETs are constituted by P-channel junction FETs.

16. An integrator according to claim 12, wherein said junction FETs are constituted by N-channel junction FETs.

* * * * *